United States Patent [19]

Sugiyama et al.

[11] Patent Number: 4,918,450
[45] Date of Patent: Apr. 17, 1990

[54] ANALOG/DIGITAL CONVERTER CIRCUIT

[75] Inventors: Hisashi Sugiyama; Yasuhiro Sugimoto, both of Yokohama, Japan

[73] Assignee: Kabushiki Kaisha Toshiba, Kawasaki, Japan

[21] Appl. No.: 367,654

[22] Filed: Jun. 19, 1989

[30] Foreign Application Priority Data

Jun. 20, 1988 [JP] Japan .................................. 63-151772

[51] Int. Cl.$^4$ ............................................. H03M 1/36
[52] U.S. Cl. ..................................... 341/159; 341/158; 341/160; 358/11
[58] Field of Search ............... 341/132, 138, 155, 158, 341/159, 160, 163, 172, 118; 358/11

[56] References Cited

U.S. PATENT DOCUMENTS

| | | | |
|---|---|---|---|
| 3,678,413 | 7/1972 | Wakeling | 341/159 |
| 4,119,960 | 10/1978 | Hill | 341/163 |
| 4,262,282 | 4/1981 | Maida | 341/159 |
| 4,323,885 | 4/1982 | Carriere et al. | 341/118 |
| 4,364,028 | 12/1982 | Masuda et al. | 341/118 |
| 4,608,555 | 8/1986 | Hoeft | 341/159 |
| 4,635,036 | 1/1987 | Yoshizawa | 341/159 |
| 4,812,817 | 3/1989 | Bernard | 341/172 |
| 4,837,527 | 6/1989 | Sauer | 341/172 |

Primary Examiner—William M. Shoop, Jr.
Assistant Examiner—G. Romano
Attorney, Agent, or Firm—Finnegan, Henderson, Farabow, Garrett and Dunner

[57] ABSTRACT

An analog/digital converter circuit including a capacitor having a first end, to which an analog voltage is applied, and a second end, an input buffer circuit having an input terminal, connected to the second end of said capacitor, and an output terminal, a reference voltage generating circuit for generating a plurality of reference voltages having different voltage levels, a voltage comparator circuit having a plurality of voltage comparators for comparing the output voltage of the input buffer circuit with each of the reference voltages generated by the reference voltage generating circuit, and generating a digital signal corresponding to the comparison results, a decoder circuit for decoding the output of the voltage comparator circuit, and D.C. bias voltage selection/supply circuit for selecting one of the reference voltages of the reference voltage generating circuit and supplying the selected reference voltage as a D.C. bias voltage to the input terminal of the input buffer circuit.

14 Claims, 3 Drawing Sheets

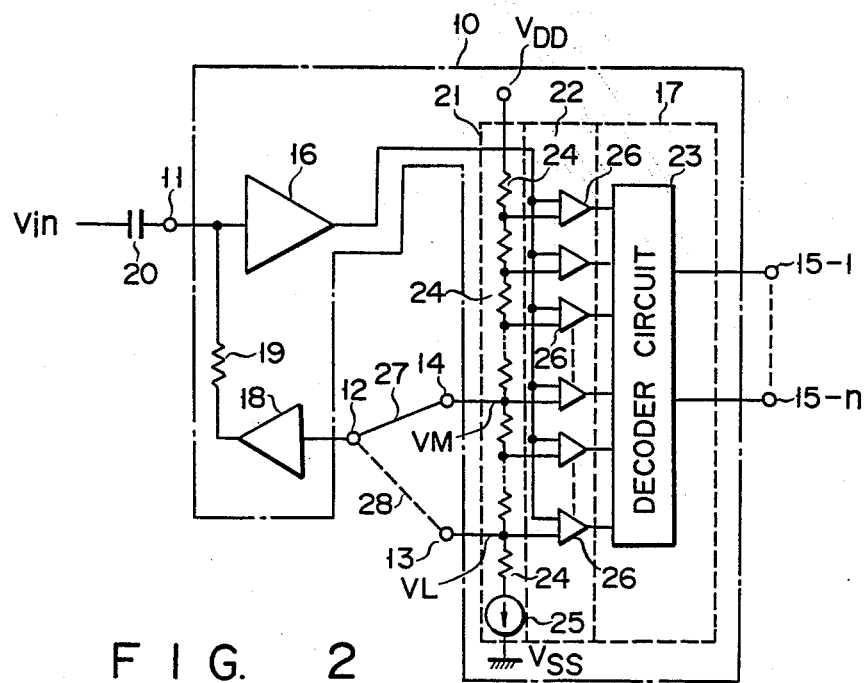
F I G. 2

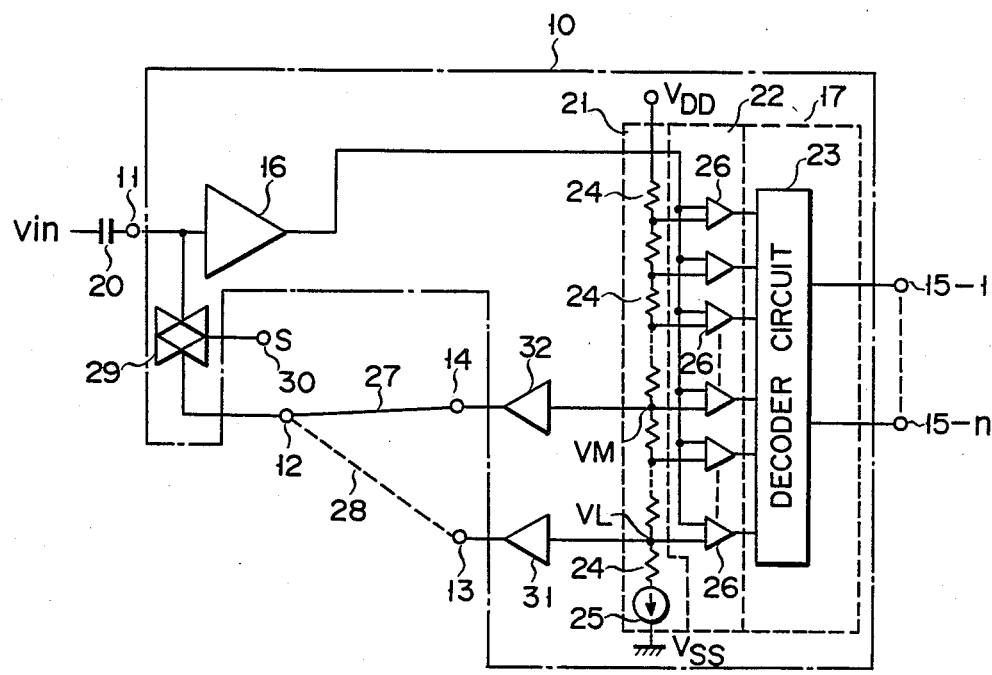
F I G. 5

ANALOG/DIGITAL CONVERTER CIRCUIT

BACKGROUND OF THE INVENTION

1. Field of the Invention

This invention relates to an analog/digital converter circuit for converting an analog signal into a digital signal and, more particularly, to an analog/digital converter circuit for use in a video signal processing circuit or the like.

2. Description of the Related Art

Recently, in the television receivers, various control operations can be omitted and special functions can be added by properly processing digital signals.

FIG. 1 is a circuit diagram of conventional analog/-digital converter circuit (which is hereinafter referred to as an A/D converter circuit) which is formed as an integrated unit and used in a digital television receiver to convert the Y signal (luminance signal) or the R-Y or G-Y signal (color difference signal) into a digital signal. A circuit portion surrounded by dot-dash lines in FIG. 1 is an internal circuit portion of integrated circuit 40 in which are formed input buffer circuit 41 for receiving an analog voltage, A/D converter section 42 for converting the output of input buffer 41 into a digital signal, and analog switch 43.

Reference voltage generating circuit 46, voltage comparator circuit 48, and decoder circuit 49 are formed in A/D converter section 42. Reference voltage generating circuit 46 includes a plurality of resistors 44 and constant current source 45 connected between power source voltage terminal $V_{DD}$ and ground voltage terminal $V_{SS}$, and voltage comparator circuit 48 includes a plurality of voltage comparators 47.

Analog signal Vin, such as the Y signal or the R-Y or G-Y signal, is supplied to input buffer circuit 41 of integrated circuit 40 via coupling capacitor 50 provided outside circuit 40. The output of input buffer circuit 41 is supplied to one input terminal of each of voltage comparators 47 of voltage comparator circuit 48, the other input terminal of each of voltage comparators 47 is supplied with a corresponding one of different reference signals which are generated at respective nodes between resistors 44 in reference voltage generating circuit 46. Decoder circuit 49 outputs digital data corresponding to comparison outputs of voltage comparators 47.

In a case where the Y signal or the R-Y or G-Y signal is converted into a corresponding digital signal, it is necessary to set the range of variation in input analog voltage Vin to equal to the dynamic range of the A/D converter circuit, so as to utilize effectively the dynamic range of the A/D converter circuit. For this reason, the conventional A/D converter circuit is provided with a pair of resistors 51 and 52 for dividing a voltage between power source voltage terminals $V_{CC}$ and $V_{EE}$ which are located outside the integrated circuit. The voltage divided by the pair of resistors 51 and 52 is supplied to emitter follower circuit 55, constituted by npn transistor 53 and resistor 54, and the output voltage of emitter follower circuit 55 is supplied to one end of analog switch 43. In the A/D converting operation, analog switch 43 is turned on by control signal S for a preset period of time so as to permit the divided voltage to be supplied to the input terminal of input buffer circuit 41. The lowest voltage in the dynamic range of the A/D converter circuit is set based on the resistance division ratio of resistors 51 and 52, as a D.C. bias voltage in a case where analog voltage Vin is the Y signal, and the intermediate voltage of the dynamic range of the A/D converter circuit is set based on the resistance division ratio of resistors 51 and 52, as the D.C. bias voltage in a case where analog voltage Vin is the R-Y or G-Y signal.

If the D.C. bias voltage is derived by resistance division as in the conventional circuit, the bias voltage derived will deviate from the initial value by virtue of variation in the resistances of resistors 51 and 52, variation in the characteristic of transistor 53 due to temperature change, variation in power source voltage $V_{CC}$ or $V_{EE}$ or the like. For this reason, it is then necessary to set the variation range of the analog voltage with a margin with respect to the dynamic range of the A/D converter circuit. Thus, the conventional A/D converter circuit has a defect in that the dynamic range of the A/D converter circuit cannot be used most effectively.

SUMMARY OF THE INVENTION

The present invention has been developed in light of the above drawback associated with the prior art, and has as an object to provide an analog/digital converter circuit in which the dynamic range can be used most effectively and a wide variation range can be set in respect of the analog voltage.

According to the present invention, there is provided an analog/digital converter circuit which comprises a capacitor having a first end, to which an analog voltage is applied, and a second end; an input buffer circuit having an input terminal, connected to the second end of the capacitor, and an output terminal; a reference voltage generating circuit for generating a plurality of reference voltages having different voltage levels; a voltage comparator circuit having a plurality of voltage comparators for comparing the output voltage of the input buffer circuit with each of the reference voltages generated by the reference voltage generating circuit, and generating a digital signal corresponding to the comparison results; a decoder circuit for decoding the output of the voltage comparator circuit; and D.C. bias voltage selection/supply means for selecting one of the reference voltages of the reference voltage generating circuit and supplying the selected reference voltage as a D.C. bias voltage to the input terminal of the input buffer circuit.

BRIEF DESCRIPTION OF THE DRAWINGS

FIG. 2 is a circuit diagram showing the construction of a first embodiment of this invention;

FIG. 5 is a circuit diagram showing the construction of a fifth embodiment of this invention.

DETAILED DESCRIPTION OF THE PREFERRED EMBODIMENTS

Figure 1:
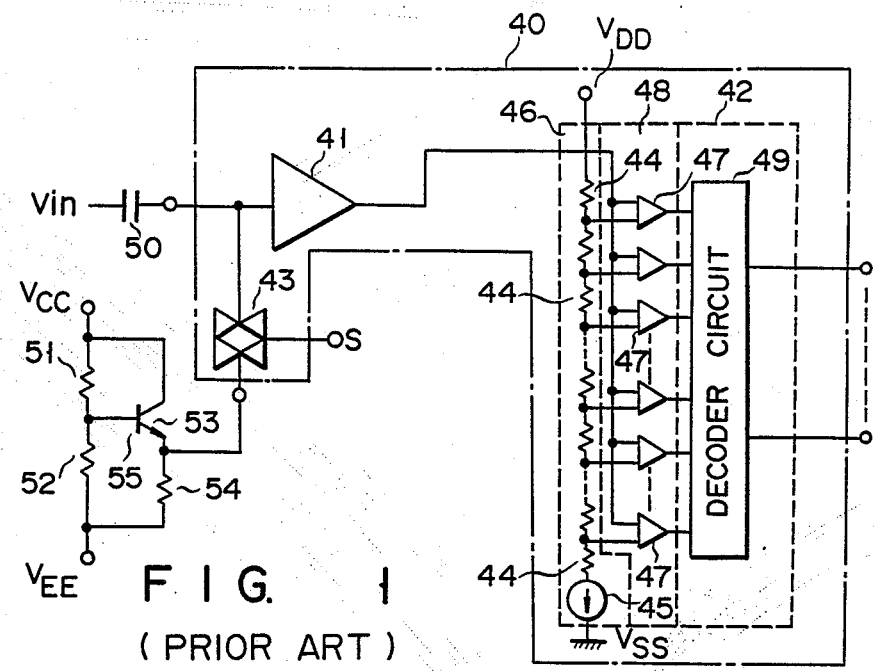
FIG. 1 is a circuit diagram of the conventional circuit.

There will now be described an embodiment of this invention with reference to the accompanying drawings.

FIG. 2 is a circuit diagram circuit diagram showing the construction of an A/D converter circuit according to one embodiment of this invention for converting a Y signal or an R-Y or G-Y signal into a digital signal.

In FIG. 2, a portion surrounded by one-dot-dash lines corresponds to an internal portion of integrated circuit 10, and the internal portion of integrated circuit 10 includes input buffer circuit 16 for receiving an input analog voltage, A/D converter section 17 for converting the output voltage of input buffer circuit 16, buffer circuit 18 and resistor 19 in addition to input terminals 11 and 12 and output terminals 13, 14 and 15-1 to 15-$n$.

The input terminal of input buffer circuit 16 is connected to input terminal 11. Input terminal 11 is supplied with analog signal Vin such as a Y signal or an R-Y or G-Y signal via capacitor 20 provided outside integrated circuit 10.

A/D converter section 17 includes reference voltage generator circuit 21 for generating a plurality of reference voltages, voltage comparator circuit 22 and decoder circuit 23.

Reference voltage generator circuit 21 includes a plurality of resistors 24 and one constant current source 25 which are connected in series between power source voltage terminal $V_{DD}$ and ground voltage terminal $V_{SS}$, and a plurality of reference voltages are derived out from nodes between series-connected resistors 24.

Further, a plurality of voltage comparators 26 are provided in voltage comparator circuit 22, and one input terminal of each of voltage comparators 26 is supplied with the output voltage of input buffer circuit 16. The other input terminal of each of voltage comparators 26 is supplied with a corresponding one of the reference voltages generated from reference voltage generator circuit 21. Each of voltage comparators 26 of voltage comparator circuit 22 generates a digital signal of "1" or "0" level based on the result of comparison between the two input voltages. A plurality of digital signals from voltage comparator circuit 22 are supplied to decoder circuit 23, converted into n-bit digital data, and then outputted from output terminals 15-1 to 15-$n$ of integrated circuit 10.

That one of nodes between resistors 24 in reference voltage generating circuit 21 from which lowest reference voltage VL is derived is connected to output terminal 13. Likewise, that one of nodes between resistors 24 in reference voltage generating circuit 21 from which intermediate reference voltage VM is derived is connected to output terminal 14.

The input terminal of buffer circuit 18 is connected to input terminal 12. Input terminal 12 is connected to output terminal 13 via a wiring or a switch in a case where analog signal Vin supplied to input terminal 11 is a Y signal, and is connected to output terminal 14 via a wiring or a switch in a case where analog signal Vin supplied to input terminal 11 is an R-Y or G-Y signal.

The output terminal of buffer circuit 18 is connected to the input terminal of input buffer circuit 16 via resistor 19.

With the A/D converter circuit of the above construction, output terminal 14 of reference voltage VM is connected to input terminal 12 via wiring 27, for example, outside integrated circuit 10 as shown by a solid line in FIG. 2 in a case where an R-Y or G-Y signal is used as analog signal Vin to be converted into a digital signal. In this case, intermediate voltage VM in the dynamic range of the A/D converter circuit or the voltage range defined by the reference voltages obtained by reference voltage generating circuit 21 is supplied as a D.C. bias voltage to the input terminal of input buffer circuit 16.

In contrast, in a case where a Y signal is used as analog signal Vin to be converted into a digital signal, output terminal 13 of reference voltage VL is connected to input terminal 12 via wiring 28, for example, outside integrated circuit 10 as shown by a broken line in FIG. 2. In this case, lowest voltage VL in the dynamic range of the A/D converter circuit is supplied as a D.C. bias voltage to the input terminal of input buffer circuit 16.

In the circuit of this embodiment, an input analog voltage is compared with respective reference voltages of voltage comparator circuit 22 in a condition that a preset D.C. bias voltage, that is, voltage VM or VL is applied thereto, and digital data is output from decoder circuit 23 based on the comparison result.

In the circuit of this embodiment, the reference voltage which is created by a plurality of resistors 24 serially connected in reference voltage generating circuit 21 is applied as a D.C. bias voltage to the input terminal of input buffer circuit 16. For this reason, even if power source voltage $V_{DD}$ has fluctuated or the ambient temperature has changed, the bias voltage of input analog voltage Vin can always be set to be equal to intermediate voltage VM or lowest voltage VL of the dynamic range of the A/D converter circuit. Therefore, the variation range of an input analog voltage can be set substantially in coincidence with the dynamic range of the A/D converter circuit so that the dynamic range of the A/D converter circuit can be effectively used.

In the above embodiment, wiring 27 or 28 is used as a means for selectively connecting two output terminals 13 and 14 to one input terminal 12. However, it is possible to selectively connect two output terminals 13 and 14 to one input terminal 12 by using a switch connected between input terminal 12 and output terminals 13 and 14 and changing the switching position of the switch.

Further, decoder circuit 23 can be formed with a desired construction if it can convert the outputs of voltage comparators 26 into n-bit digital data.

Figure 3:
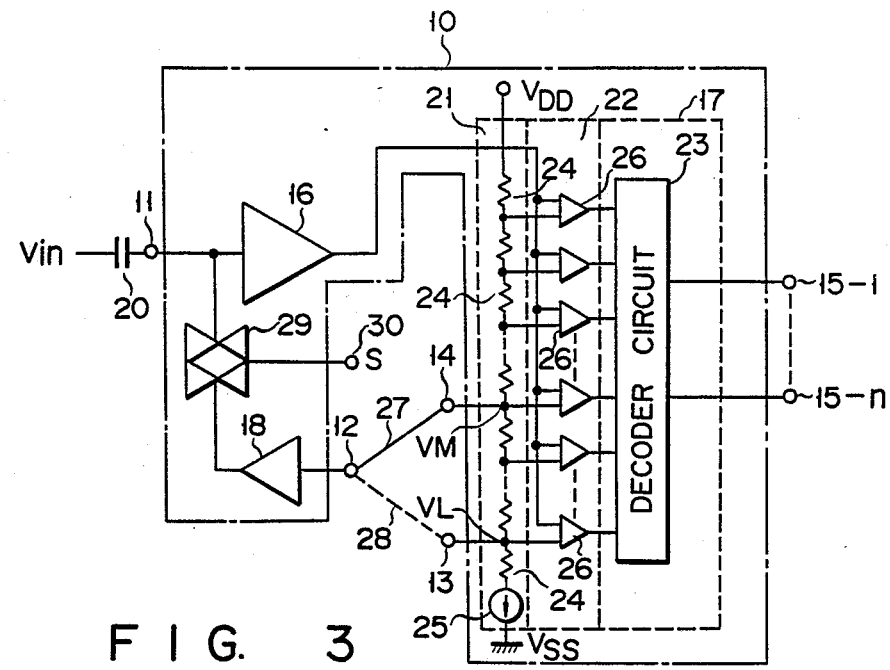
FIG. 3 is a circuit diagram showing the construction of a second embodiment of this invention.

FIG. 3 is a circuit diagram showing the construction of an A/D converter circuit according to a second embodiment of this invention. Also, in this embodiment, a Y signal or an R-Y or G-Y signal is converted into a digital signal. In the circuit of FIG. 3, portions which correspond to those of FIG. 2 are denoted by the same reference numerals and the explanation therefor is omitted.

The circuit of this embodiment is similar to that of FIG. 2 except that analog switch 29 is provided in integrated circuit 10 and the output terminal of buffer circuit 18 is connected to the input terminal of input buffer circuit 16 not via resistor 19 but via analog switch 29. Further, in the circuit of this embodiment, input terminal 30 is additionally provided in integrated circuit 10 and input terminal 30 is connected to the control terminal of analog switch 29. The operation of analog switch 29 is controlled by control signal S supplied to input terminal 30.

In the circuit of this embodiment, analog switch 29 is turned on for a preset period of time in response to control signal S when the A/D conversion is effected. Since, at this time, like resistor 19, analog switch 29 functions as a resistor element, input analog signal Vin is superimposed on the D.C. bias voltage at the input terminal of input buffer circuit 16. In the turn-off period set after this, D.C. bias voltage VL or VM is held by capacitor 20. That is, input analog voltage Vin is clamped at D.C. bias voltage VL or VM in the turn-on period of analog switch 29.

Figure 4:
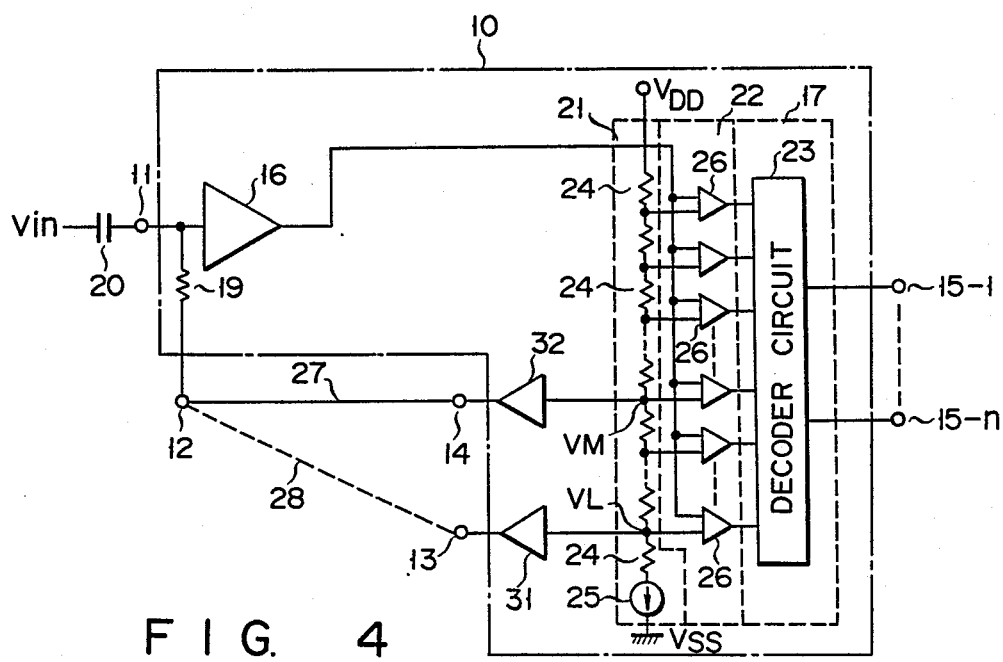
FIG. 4 is a circuit diagram showing the construction of a third embodiment of this invention.

FIG. 4 is a circuit diagram showing the construction of an A/D converter circuit according to a third embodiment of this invention. Also, in this embodiment, an analog signal such as a Y signal or an R-Y or G-Y signal is converted into a digital signal. The circuit of this embodiment is similar to that of the FIG. 2 embodiment except that buffer circuit 18 is omitted, resistor 19 is connected between the input terminal of input buffer circuit 16 and input terminal 12, two buffer circuits 31 and 32 are provided inside integrated circuit 10, the input terminals of buffer circuits 31 and 32 are connected to the nodes of reference voltage generating circuit 21 at which reference voltages VL and VM are derived, and the output terminals of buffer circuits 31 and 32 are connected to output terminals 13 and 14. Also, in this embodiment, output terminals 13 and 14 are selectively connected to input terminal 12 via wiring 28 or 27.

FIG. 5 is a circuit diagram showing the construction of an A/D converter circuit according to a fourth embodiment of this invention. Also, in this embodiment, an analog signal such as a Y signal or an R-Y or G-Y signal is converted into a digital signal. Like the circuit of the FIG. 3 embodiment, in the circuit of this embodiment, analog switch 29 is used, and like the circuit of the FIG. 4 embodiment, two buffer circuits 31 and 32 are used instead of buffer circuit 18 and output terminals 13 and 14 ar selectively connected to input terminal 12.

Like the circuit of the embodiment of FIG. 2, in each of the embodiments of FIGS. 3 to 5, one of the reference voltages generated from reference voltage generating circuit 21 is applied as a D.C. bias voltage to the input terminal of input buffer circuit 16. Therefore, the bias voltage level of the input analog voltage can be set to be equal to intermediate voltage VM or lowest voltage VL in the dynamic range of the A/D converter circuit. As a result, the dynamic range of the A/D converter circuit can be effectively utilized.

This invention is not limited to the above embodiments, but various modification can be made. For example, in each of the above embodiments, a Y signal or an R-Y or G-Y signal is used as an analog signal and converted into a digital signal. However, this invention can be applied to any circuit which effects the A/D conversion while a D.C. bias voltage is being applied to the circuit. Therefore, a D.C. bias voltage supplied to the input buffer circuit is not limited to the intermediate voltage or lowest voltage in the dynamic range of the A/D converter circuit, and it is possible to select various reference voltages and supply a selected one of the reference voltages as a D.C. bias voltage.

As described above, according to this invention, an analog/digital converter circuit in which since reference voltages derived by use of a plurality of resistors can be selectively used as a D.C. bias voltage of the input buffer circuit, the dynamic range thereof can be effectively used, thereby making it possible to set a wide variation range of an analog signal.

What is claimed is:

1. An analog/digital converter circuit comprising:
a capacitor having a first end, to which an analog voltage is applied, and a second end;
an input buffer circuit having an input terminal, connected to the second end of said capacitor, and an output terminal;
a reference voltage generating circuit for generating a plurality of reference voltages having different voltage levels;
a voltage comparator circuit having a plurality of voltage comparators for comparing the output voltage of said input buffer circuit with each of the reference voltages generated by said reference voltage generating circuit, and generating a digital signal corresponding to the comparison results;
a decoder circuit for decoding the output of said voltage comparator circuit; and
D.C. bias voltage selection/supply means for selecting one of the reference voltages of said reference voltage generating circuit and supplying the selected reference voltage as a D.C. bias voltage to the input terminal of said input buffer circuit.

2. An analog/digital converter circuit according to claim 1, wherein said reference voltage generating circuit includes a plurality of resistors and a constant current source serially connected between a first power source voltage terminal and a second power source voltage terminal, and said plurality of reference voltages are derived from nodes between said plurality of resistors.

3. An analog/digital converter circuit according to claim 1, wherein said D.C. bias voltage selection/supply means includes:
selection means for selecting one of the lowest reference voltage and the intermediate voltage from among the plurality of reference voltages generated by said reference voltage generating circuit; and
a resistor element for supplying a reference voltage selected by means of said selection means to the input terminal of said input buffer circuit.

4. An analog/digital converter circuit according to claim 3, wherein said resistor element is a resistor.

5. An analog/digital converter circuit according to claim 3, wherein said resistor element is an analog switch whose conduction state is controlled by a control signal.

6. An analog/digital converter circuit according to claim 1, wherein said D.C. bias voltage selection/supply means includes:
a first buffer circuit, having an output terminal and an input terminal connected to receive the lowest reference voltage from among the plurality of reference voltages generated by said reference voltage generating circuit;
a second buffer circuit, having an output terminal and an input terminal connected to receive the intermediate reference voltage from among the plurality of reference voltages generated by said reference voltage generating circuit;
selection means for selecting one of the output voltages of said first and second buffer circuits and supplying the selected output voltage to the input terminal of said input buffer circuit; and
a resistor element for supplying a reference voltage selected by means of said selection means to the input terminal of said input buffer circuit.

7. An analog/digital converter circuit comprising:
a capacitor having a first end, to which an analog voltage is applied, and a second end;
an integrated circuit;
a first input terminal, which is formed inside said integrated circuit and is connected to the second end of said capacitor;

an input buffer circuit which is formed inside said integrated circuit and has an output terminal and an input terminal connected to said first input terminal;

a reference voltage generating circuit formed inside said integrated circuit, for generating a plurality of reference voltages having different voltage levels;

a voltage comparator circuit formed inside said integrated circuit and having a plurality of voltage comparators for comparing the output voltage of said input buffer circuit with each of the reference voltages generated by said reference voltage generating circuit, and generating a digital signal corresponding to the comparison results;

a decoder circuit formed inside said integrated circuit, for decoding the output of said voltage comparator circuit; and first and second output terminals formed inside said integrated circuit, for deriving the lowest voltage and the intermediate voltage from among the reference voltages of said reference voltage generating circuit to the exterior of said integrated circuit;

selection means formed outside said integrated circuit, for selecting one of reference voltages output from said first and second output terminals;

a second input terminal, formed inside said integrated circuit, for receiving a reference voltage selected by means of said selection means; and a resistor element formed inside said integrated circuit and connected between said second input terminal and the input terminal of said input buffer circuit.

8. An analog/digital converter circuit according to claim 7, wherein said reference voltage generating circuit includes a plurality of resistors and a constant current source serially connected between a first power source voltage terminal and a second power source voltage terminal, and said plurality of reference voltages are derived from nodes between said plurality of resistors.

9. An analog/digital converter circuit according to claim 7, wherein said resistor element is a resistor.

10. An analog/digital converter circuit according to claim 7, wherein said resistor element is an analog switch whose conduction state is controlled by a control signal.

11. An analog/digital converter circuit comprising:

a capacitor having a first end, to which an analog voltage is applied, and a second end;

an integrated circuit;

a first input terminal which is formed inside said integrated circuit and is connected to the second end of said capacitor;

an input buffer circuit which is formed inside said integrated circuit and has an output terminal and an input terminal connected to said first input terminal;

a reference voltage generating circuit formed inside said integrated circuit, for generating a plurality of reference voltages having different voltage levels;

a voltage comparator circuit formed inside said integrated circuit and having a plurality of voltage comparators for comparing the output voltage of said input buffer circuit with each of the reference voltages generated by said reference voltage generating circuit, and generating a digital signal corresponding to the comparison results;

a decoder circuit formed inside said integrated circuit, for decoding the output of said voltage comparator circuit;

a first buffer circuit, formed inside said integrated circuit and having an output terminal and an input terminal connected to receive the lowest reference voltage of the plurality of reference voltages generated by said reference voltage generating circuit;

a second buffer circuit, formed inside said integrated circuit and having an output terminal and an input terminal connected to receive the intermediate reference voltage of the plurality of reference voltages generated by said reference voltage generating circuit;

a first output terminal, formed inside said integrated circuit and connected to the output terminal of said first buffer circuit;

a second output terminal, formed inside said integrated circuit and connected to the output terminal of said second buffer circuit;

a second input terminal, formed inside said integrated circuit;

a resistor element formed inside said integrated circuit and connected between said second input terminal and the input terminal of said input buffer circuit; and selection means formed outside said integrated circuit, for selecting one of reference voltages output from said first and second output terminals and supplying the selected reference voltage to said second input terminal.

12. An analog/digital converter circuit according to claim 11, wherein said reference voltage generating circuit includes a plurality of resistors and a constant current source serially connected between a first power source voltage terminal and a second power source voltage terminal, and said plurality of reference voltages are derived from nodes between said plurality of resistors.

13. An analog/digital converter circuit according to claim 11, wherein said resistor element is a resistor.

14. An analog/digital converter circuit according to claim 11, wherein said resistor element is an analog switch whose conduction state is controlled by a control signal.

* * * * *